United States Patent
Chiang

(10) Patent No.: US 8,449,315 B2
(45) Date of Patent: May 28, 2013

(54) LINKAGE DEVICE AND PROGRAMMABLE CONTROL UNIT USING THE SAME

(75) Inventor: Tzu-Tsung Chiang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 13/241,884

(22) Filed: Sep. 23, 2011

(65) Prior Publication Data

US 2012/0291357 A1    Nov. 22, 2012

(30) Foreign Application Priority Data

May 16, 2011   (TW) .................................. 100117046

(51) Int. Cl.
*H01R 13/62* (2006.01)
(52) U.S. Cl.
USPC ......................................................... 439/372
(58) Field of Classification Search
USPC ............... 439/345, 352, 372, 15; 361/679.43, 361/679.31; 174/66
See application file for complete search history.

(56) References Cited

U.S. PATENT DOCUMENTS

| | | | |
|---|---|---|---|
| 4,722,693 A * | 2/1988 | Rose | 439/137 |
| 6,919,510 B1 * | 7/2005 | Chen | 174/66 |
| 7,554,035 B2 * | 6/2009 | Chen | 174/66 |
| 7,556,513 B2 * | 7/2009 | Ng et al. | 439/137 |
| 7,612,993 B1 * | 11/2009 | Takei et al. | 361/679.31 |
| 7,742,294 B2 * | 6/2010 | Gadau et al. | 361/679.43 |
| 2002/0027771 A1 * | 3/2002 | Dong | 361/685 |

* cited by examiner

*Primary Examiner* — Alexander Gilman
(74) *Attorney, Agent, or Firm* — Muncy, Geissler, Olds & Lowe, PLLC

(57) ABSTRACT

A linkage device cooperating with a casing, which has a connecting port, is disclosed. The linkage device includes a barrier and a push bar. The barrier is pivotly disposed on the casing and is positioned at a first position or a second position with respect to the connecting port of the casing. When the barrier is at the first position, the barrier covers at least a part of the connecting port; otherwise, when the barrier is at the second position, the barrier does not cover the connecting port. The push bar is slidingly disposed on the casing and abuts against the barrier. When the push bar pushes the barrier, the barrier rotates from the first position to the second position. A programmable control unit using the linkage device is also disclosed. The programmable control unit is assembled with a bottom board. The bottom board pushes the push bar to rotate the barrier from the first position to the second position.

6 Claims, 7 Drawing Sheets

LINKAGE DEVICE AND PROGRAMMABLE CONTROL UNIT USING THE SAME

CROSS REFERENCE TO RELATED APPLICATIONS

This Non-provisional application claims priority under 35 U.S.C. §119(a) on Patent Application No(s). 100117046 filed in Taiwan, Republic of China on May 16, 2011, the entire contents of which are hereby incorporated by reference.

BACKGROUND OF THE INVENTION

1. Field of Invention

The present invention relates to a linkage device and a programmable control unit using the same.

2. Related Art

Programmable logic controllers (PLC) are electronic operation control systems. The PLC uses the programmable memory to store the instructions for executing the functions such as logic, sequence, timing, counting and calculation. Besides, the PLC further uses the digital/analog input output module to control various machines or procedures.

Since the programmable controller has the advantages of simple operation, less manpower cost, and flexible in design, it has been widely applied to the industrial control automation. In practice, it is possible to use multiple programmable control units with different functions according to various requirements. The programmable control units can be optionally assembled or installed on a bottom board and a frame through their connecting ports, thereby forming an expandable programmable controller.

However, when the programmable control unit is assembled with the bottom board, the connecting port thereof must be aligned to and inserted into the corresponding connector of the bottom board. If the connecting port of the programmable control unit is touched, it is highly possible to affect the electrical reliability thereof, which may result in the short circuit or damage of the programmable control unit.

Therefore, it is an important subject of the invention to provide a linkage device and a programmable control unit using the same that can be easily and actually assembled and can avoid the undesired contact, which may affect the electrical properties. Accordingly, the invention can prevent the short circuit and damage of the programmable control unit during the assembling procedure, thereby increasing the reliability of the programmable control unit and decreasing the assembling cost for operators.

SUMMARY OF THE INVENTION

In view of the foregoing subject, an object of the present invention is to provide a linage device and a programmable control unit using the same that can be easily and actually assembled and can avoid the undesired contact, which may affect the electrical properties. Accordingly, the invention can prevent the short circuit and damage of the programmable control unit during the assembling procedure, thereby increasing the reliability of the programmable control unit and decreasing the assembling cost for operators.

To achieve the above object, the present invention discloses a linkage device cooperating with a casing, which has a connecting port. The linkage device includes a barrier and a push bar. The barrier is pivotly disposed on the casing and positioned at a first position or a second position with respect to the connecting port of the casing. When the barrier is at the first position, the barrier covers at least a part of the connecting port; otherwise, when the barrier is at the second position, the barrier does not cover the connecting port. The push bar is slidingly disposed on the casing and abuts against the barrier. Accordingly, when the push bar pushes the barrier, the barrier rotates from the first position to the second position.

In one embodiment, the casing comprises a recess, and the linkage device is disposed in the recess. Preferably, the recess comprises at least one fixing portion for fixing the linkage device. When the barrier is disposed at the second position, the barrier is received in the recess.

In one embodiment, the barrier is thick enough to protrude from the casing.

In one embodiment, the linkage device further comprises an elastic element connected between the casing and the push bar. When the push bar is pushed, the push bar presses against the elastic element.

To achieve the above object, the present invention also discloses a programmable control unit assembled with a bottom board. The programmable control unit comprises a casing and a linkage device. The casing comprises a connecting port, and the linkage device comprises a barrier and a push bar. The barrier is pivotly disposed on the casing and positioned at a first position or a second position with respect to the connecting port. When the barrier is at the first position, the barrier covers at least a part of the connecting port; otherwise, when the barrier is at the second position, the barrier does not cover the connecting port. The push bar is slidingly disposed on the casing and abuts against the barrier. The bottom board pushes the push bar to rotate the barrier from the first position to the second position.

In one embodiment, the casing comprises a recess, and the linkage device is disposed in the recess. Preferably, the recess comprises at least one fixing portion for fixing the linkage device. When the barrier is disposed at the second position, the barrier is received in the recess.

In one embodiment, the programmable control unit is assembled with the bottom board through the connecting port.

In one embodiment, the barrier is thick enough to protrude from the casing.

In one embodiment, the linkage device further comprises an elastic element connected between the casing and the push bar, and when the push bar is pushed by the bottom board, the push bar presses against the elastic element.

In one embodiment, the casing comprises an orientating portion. When the programmable control unit is assembled with the bottom board, the programmable control unit and the bottom board form an angle to allow the orientating portion to abut against the bottom board, and the programmable control unit rotates with the orientating portion as an axis to contact against the bottom board. Preferably, the push bar passes through the orientating portion, and when the programmable control unit rotates with the orientating portion as the axis to contact against the bottom board, the bottom board pushes the push bar.

As mentioned above, the linkage device can use the push bar, which moves linearly, to drive the barrier to rotate, thereby changing the position of the barrier to open or close the connecting port of the casing. This configuration can move the barrier between the closing position (first position) and the opening position (second position) within a short distance of displacement. Accordingly, it is possible to prevent the connecting port from being contacted by undesired objects or to avoid the undesired installation. In addition, since the push bar is slightly protruded from the casing, the appearance of the casing is not interfered. This can keep the beautiful and original appearance of the casing, which may also decrease the cost. Moreover, the linkage device of the invention can be a detachable structure. In practice, the corners thereof have the round-corner design for facilitating the following assembling. Besides, the linkage device can be made of recyclable plastic materials.

The programmable control unit of the invention can be assembled with the bottom board through the linkage device as well as the above-mentioned operation of rotating the barrier. To assemble the programmable control unit with the bottom board, one end of the programmable control unit is positioned on the bottom board, and then rotated to allow the surface with the connecting port to abut against the bottom board. During the rotation of the programmable control unit, the linkage device is pushed from the closing position to the opening position. The programmable control unit with the linkage device can be easily and actually assembled and can avoid the undesired contact, which may affect the electrical properties. Accordingly, the invention can prevent the short circuit and damage of the programmable control unit during the assembling procedure, thereby increasing the reliability of the programmable control unit and decreasing the assembling cost for operators.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
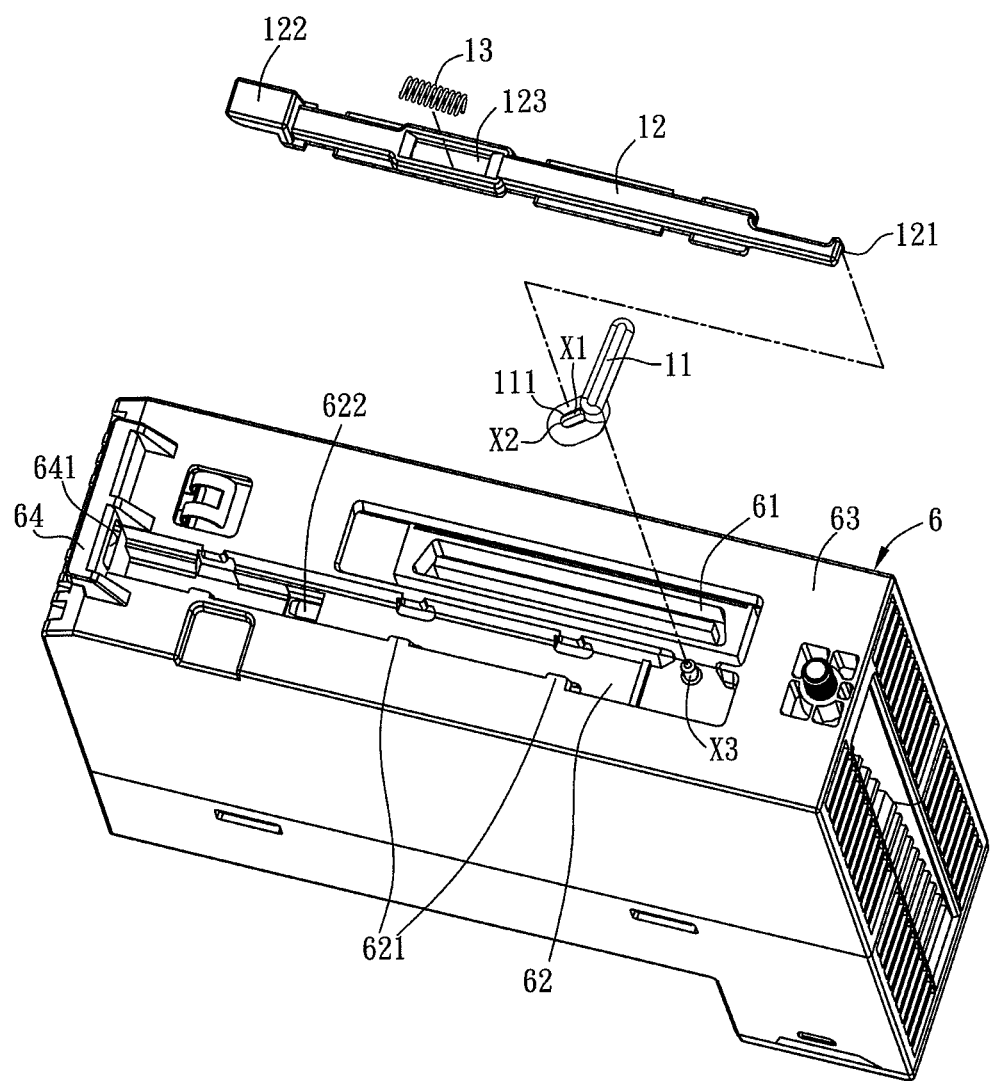
FIG. 1 is an exploded view of a linkage device according to a preferred embodiment of the invention, wherein the linkage device is at a first position.
Figure 2A:
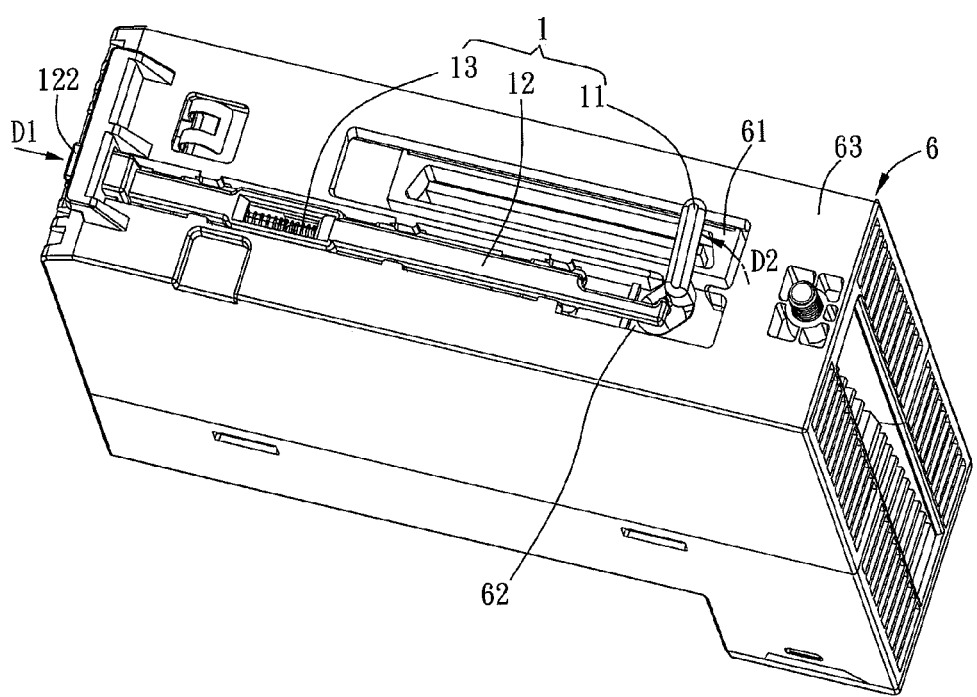
FIG. 2A is an assembled view of the linkage device according to the preferred embodiment of the invention, wherein the linkage device is at the first position.
Figure 2B:
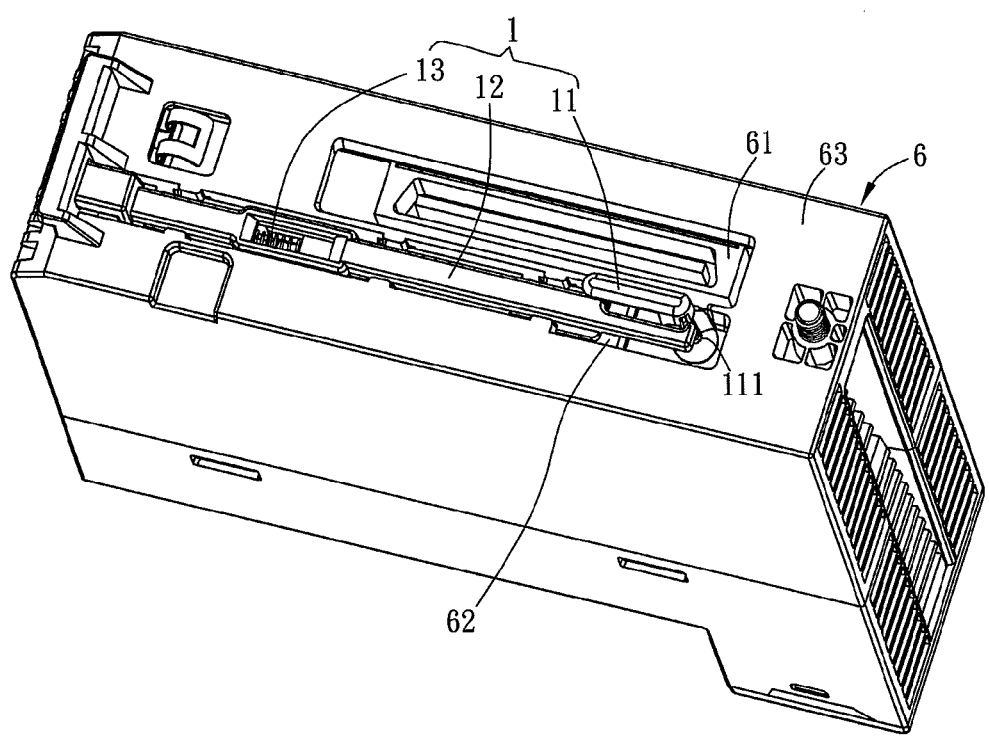
FIG. 2B is an assembled view of the linkage device according to the preferred embodiment of the invention, wherein the linkage device is at a second position.

FIG. 1 is an exploded view of a linkage device 1 according to a preferred embodiment of the invention, wherein the linkage device 1 is at a first position. FIG. 2A is an assembled view of the linkage device 1, which is at the first position, and FIG. 2B is an assembled view of the linkage device 1, which is at a second position. Referring to FIGS. 1, 2A and 2B, the linkage device 1 is cooperating with a casing 6, which has a connecting port 61. The linkage device 1 includes a barrier 11 and a push bar 12. The barrier 11 and the push bar 12 can be made of, for example but not limited to, plastic steal or other recyclable plastic materials.

The barrier 11 is pivotally disposed on the casing 6 and positioned at a first position (see FIG. 2A) or a second position (see FIG. 2A) with respect to the connecting port 61. When the barrier 11 is at the first position, it covers at least a part of the connecting port 61; otherwise, when the barrier 11 is at the second position, it does not cover the connecting port 61. In other words, the barrier 11 can optionally cover the connecting port 61, which prevents the connecting port 61 from connecting with the corresponding connector (not shown). In this embodiment, the casing 6 includes a recess 62, and the linkage device 1 is disposed in the recess 62 and is not protruded from the casing 6. Alternatively, the barrier 11 can be pivotly disposed in the recess 62, and it can be detachable or undetachable. When the barrier 11 is disposed at the second position, it is received in the recess 62 without covering the connecting port 61. Besides, the recess 62 may include at least one fixing portion 621 for fixing the linkage device 1. In practice, after the linkage device 1 is received in the recess 62 and moved to the desired operation position, the fixing portion 621 can fix the linkage device 1 to prevent it from being out of the recess 62.

For example, the barrier 11 includes an ellipsoid body and a short rod. In this embodiment, the corners of the barrier 11 are all round corners, which can facilitate the assembling. In addition, the barrier 11 at the first position is perpendicular to the connecting port 61. To be noted, the barrier 11 can have any shape, size, amount, position, and angle with respect to the connecting port 61 that allows the barrier 11 at the first position to block the connection between the connecting port 61 and the corresponding connector (not shown). Of course, in other aspects, the barrier 11 at the first position may cover the entire connecting port 61 to prevent the connecting port 61 from contacting with other object.

To be noted, the barrier 11 is thick enough to protrude from recess 62 and the casing 6. Thus, the barrier 11 can still prevent the connecting port 61 from contacting with other object even if a large pressure is applied to the barrier 11. In order to protect the barrier 11 from being crushed by the applied large pressure, it is desired to allow two ends of the barrier 11 to be located at opposite sides of the connecting port 61 and urged against an outer surface 63 of the casing 6 when the barrier 11 is at the second position.

The push bar 12 is slidingly disposed on the casing 6 and abuts against the barrier 11. In this embodiment, the push bar 12 is detachably disposed in the recess 62. One end of the push bar 12 has a second connecting portion 121 for connecting with a first connecting portion 111 of the barrier 11, so that the push bar 12 can abut against the barrier 11. The other end of the push bar 12 has a bending design, so that a pushing portion 122 of the push bar 12 can protrude from the recess 62 and the outer surface 63 of the casing 6. A force can be applied to the pushing portion 122 for moving the push bar 12, thereby switching the barrier 11 between the first and second positions. In this embodiment, the second connecting portion 121 of the pushing bar 12 is a protruding portion, and the first connecting portion 111 of the barrier 11 is a through hole. However, this invention is not limited to this, and the first connecting portion 111 and the second connecting portion 121 can be any structures capable of correspondingly connecting with each other. For example, the first connecting portion 111 may be a concave portion. Alternatively, it is also possible to form a through hole or a concave portion on the push bar 12 and form a protruding portion on the barrier 11.

When the push bar 12 pushes the barrier 11, the barrier 11 rotates from the first position to the second position. The operation of the linkage device 1 as well as the corresponding changing of the barrier 11 will be described hereinafter.

Figure 5A:
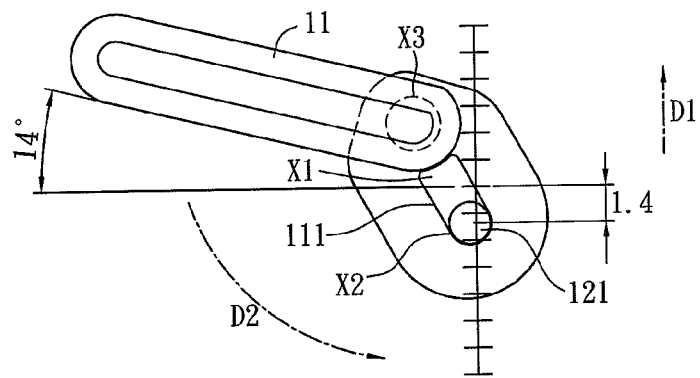
FIGS. 5A to 5C are partial enlarged views showing the operation of the barrier and the push bar.
Figure 5B:
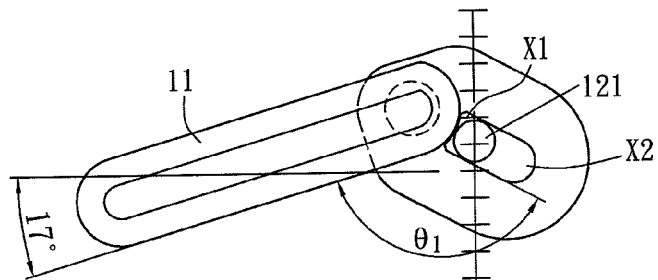
Figure 5C:
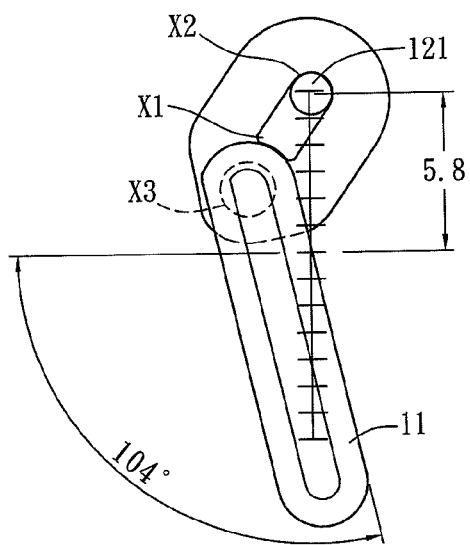

Referring to FIGS. 1, 2A and 2B, a force is applied to the pushing portion 122 along the direction D1, so that the push bar 12 slides along the direction D1. Thus, the second connecting portion 121 can push the first connecting portion 111 of the barrier 11. In practice, the first connecting portion 111 is a long-shaped through hole while the second connecting portion 121 is a protruding portion. An angle $\theta_1$ between the barrier 11 and the first connecting portion 111 is between 90 to 180 degrees, and is preferably 135 degrees. FIGS. 5A to 5C are partial enlarged views showing the operation of the barrier 11 and the push bar 12. When the push bar 12 slides along the direction D1, the protruding portion of the second connecting portion 121 moves in the long-shaped through hole of the first connecting portion 111 from the position X2 (see FIG. 5A) to the opposite position X1 (see FIG. 5B), and then moves back to the position X2 (see FIG. 5C). At the same time, the first connecting portion 111 is pushed to rotate the barrier 11 about the axis (position X3) along the counterclockwise direction D2. Consequently, the barrier 11 is rotated from the position partially covering the connecting port 61 (se FIG. 2A) to the position uncovering the connecting port 61 and received in the recess 62 (see FIG. 2B). After the above operation of the linkage device 1, the connecting port 61 can be exposed so that it is possible to insert an object in the connecting port 61.

To be noted, the long-shaped through hole of the first connecting portion 111 has a longitudinal direction pointing toward the position X3 where the barrier 11 is disposed on the casing 6. The long-shaped through hole can maintain the linear movement of the push bar 12 toward the direction D1. In other words, the long-shaped through hole can prevent the movement of the push bar 12 toward the direction perpendicular to the direction D1 due to the rotation of the barrier 11. For example, as shown in FIGS. 5A to 5C, the angle $\theta_1$ between the barrier 11 and the first connecting portion 111 is 135 degrees, and the push bar 12 is pushed so that the second connecting portion 121 is shifted for 2.4 mm. In this case, the barrier 11 is rotated counterclockwise for about 31 degrees from the first position (see FIG. 5A) to the position as shown in FIG. 5B. Then, the push bar 12 is continuously rotated so that the second connecting portion 121 is further shifted for 4.8 mm. Thus, the barrier 11 is rotated counterclockwise for about 87 degrees from the position as shown in FIG. 5B to the second position. As mentioned above, when the push bar 12 linearly moves for 7.2 mm, the barrier 11 can be rotated for 118 degrees. This operation can easily switch the barrier 11 between the first and second positions. Of course, the angle between the barrier 11 and the first connecting portion 111, the length of the first connecting portion 111, and the position X3 wherein the barrier 11 is pivotly disposed on the casing 6 as described above are all for example only and are not to limit the present invention.

Furthermore, the linkage device 1 may further include an elastic element 13 connected between the casing 6 and the push bar 12. In more detailed, when the push bar 12 is pushed, it can not only push the barrier 11 but also press against the elastic element 13. During the movement of the push bar 12, the elastic element 13 can continuously apply a feedback force to the push bar 12 until the end of the movement of the push bar 12. Accordingly, the push bar 12 can go back to its original position depending on the feedback force, and correspondingly move the barrier 11 from the second position back to the first position.

The elastic element 13 is, for example but not limited to, a spring or other recover elements or mechanisms. In this embodiment, one end of the elastic element 13 is detachably telescoped on a tube 622 in the recess 62 of the casing 6, and the push bar 12 may have an opening 123 disposed corresponding to the elastic element 13. Thus, the elastic element 13 can be assembled between the tube 622 and the inner wall of the opening 123.

To be noted, the protruded length of the pushing portion 122 is also the maximum moving distance of the push bar 12. If the linkage device 1 only use the linear movement of the push bar 12 to control the linear movement of the barrier 11 between the covering and uncovering positions, the moving distance of the push bar 12 must be long enough, which may cause the portion obviously protruding from the casing 6. This may interrupt the appearance of the casing 6, and may also result in the change of the design of the casing 6, which always increases the manufacturing cost. In this invention, the linkage device 1 includes both a linear movement and a rotation movement, so that the protruded length of the pushing portion 122 is smaller (about 0.5 cm). Thus, the appearance of the casing 6 is not interrupted, so that it is unnecessary to change the design of the casing 6.

Figure 3A:
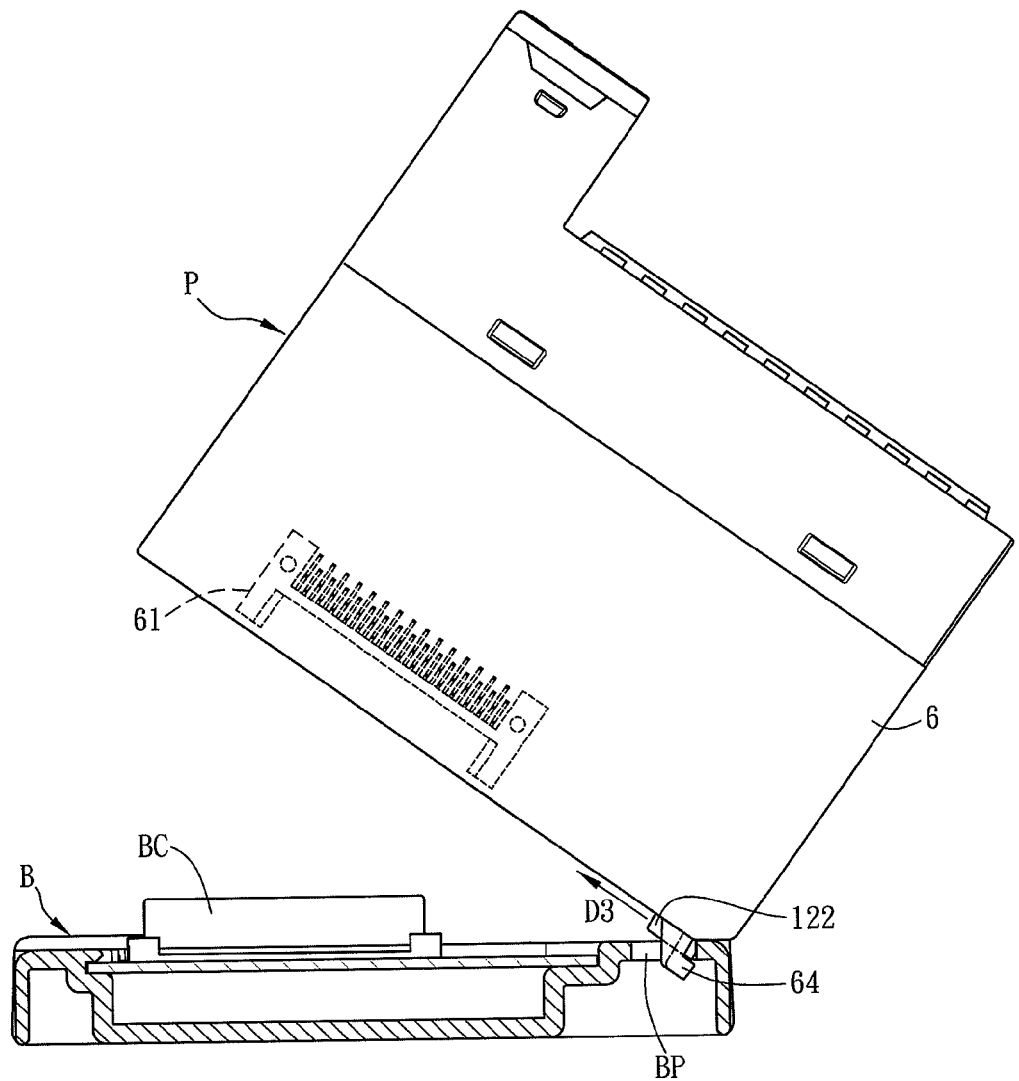
FIGS. 3A and 3B are schematic diagrams showing the assembling operation of the programmable control unit and the bottom board.
Figure 3B:
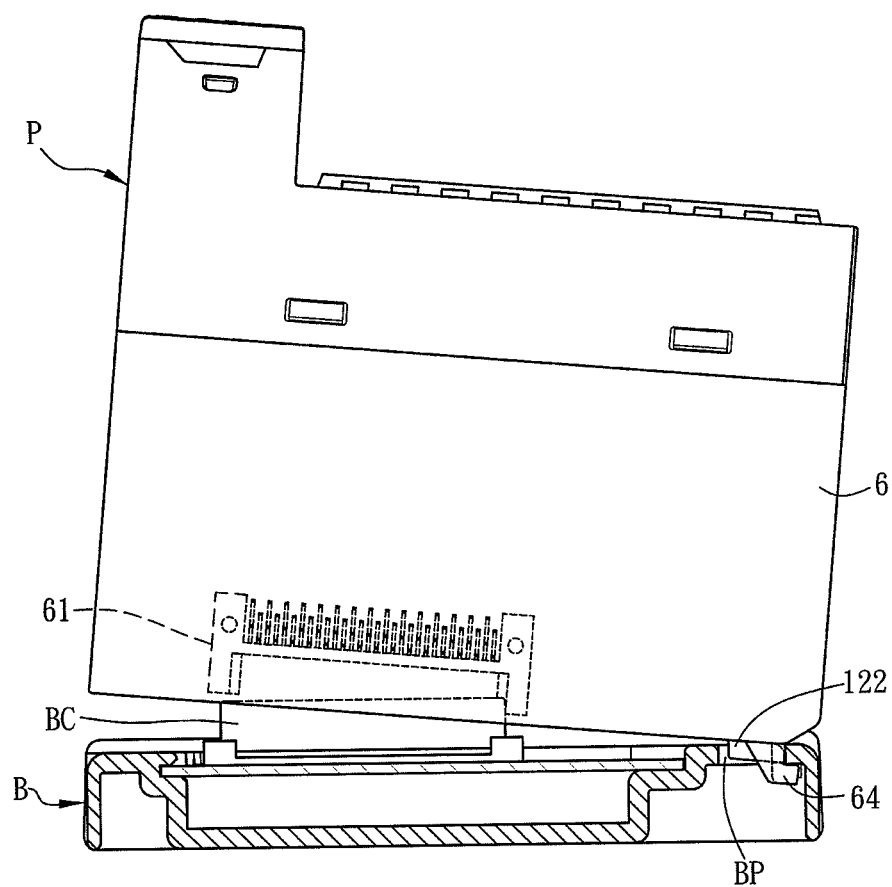

With reference to FIGS. 3A and 3B, the present invention also discloses a programmable control unit P, which is installed on a bottom board B. The programmable control unit P includes a casing 6 and a linkage device 1. FIGS. 3A and 3B are schematic diagrams showing the assembling operation of the programmable control unit P and the bottom board B. Wherein, the structures and configurations of the casing 6 and the linkage device 1 of the programmable control unit P are describe in the previous embodiment, so the detailed descriptions thereof will be omitted here. The following description only illustrates the operation of the linkage device 1 for assembling the programmable control unit P and the bottom board B.

Figure 4A:
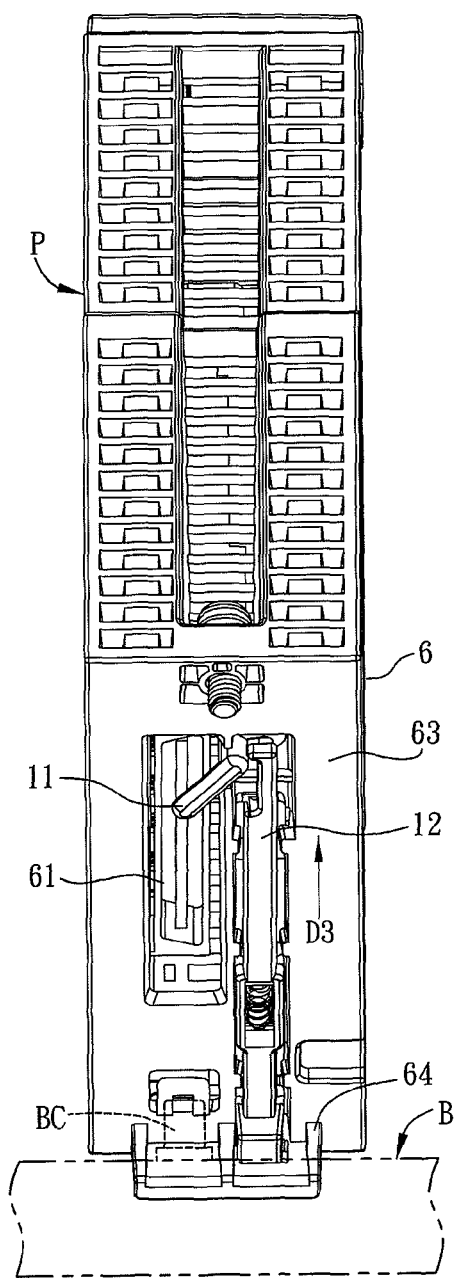
FIGS. 4A and 4B are schematic diagrams showing operation of the linkage device during the assembling operation of the programmable control unit and the bottom board.
Figure 4B:
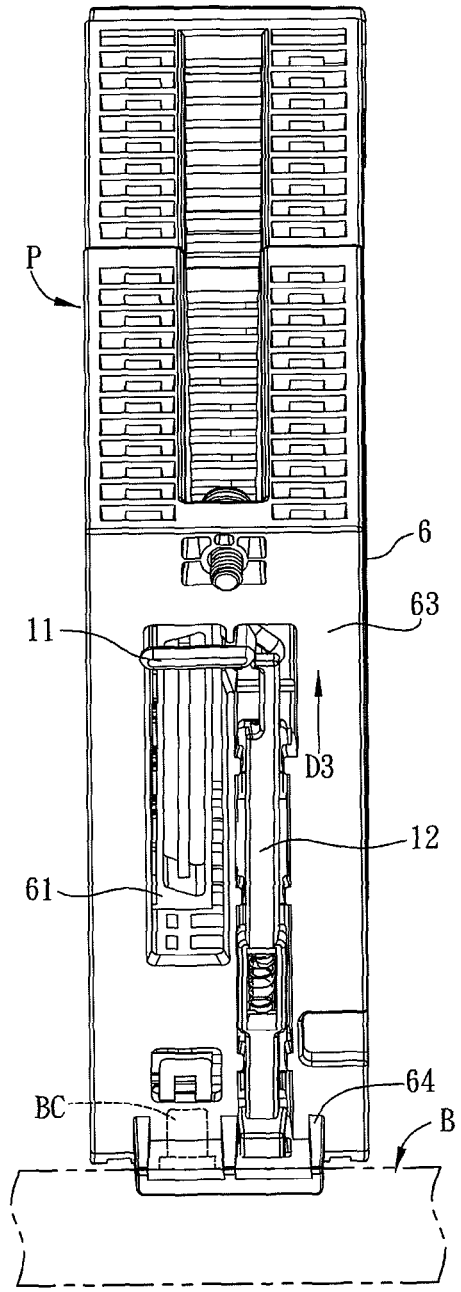

To make the following description more clear, FIGS. 3A and 3B only show the relative positions of the bottom board B and the casing 6 of the programmable control unit P and the positions of the pushing portion 122 of the linkage device 1 protruding from the casing 6. Other operations of the linkage device 1 are illustrated with reference to FIGS. 4A and 4B, wherein FIGS. 4A and 4B are schematic diagrams showing operation of the linkage device 1 during the assembling operation of the programmable control unit P and the bottom board B.

To be noted, it is possible to install multiple programmable control units P on the bottom board B. The programmable control unit P is installed with the bottom board B by assembling the connecting port 61 of the casing 6 with the board connector BC of the bottom board B. During the installation of the programmable control unit P and the bottom board B, the bottom board B pushes the pushing portion 122 of the push bar 12, so that the push bar 12 pushes the barrier 11 to rotate from the first position to the second position. In other words, FIGS. 3A and 4A show the programmable control unit P before the installation, wherein the push bar 12 of the linkage device 1 is not pushed, and the barrier 11 is located at the first position and covers the connecting port 61. FIGS. 3B and 4B show the programmable control unit P during the installation, wherein the push bar 12 of the linkage device 1 has been pushed, and the barrier 11 is moving from the first position to the second position.

In more detailed, the casing has an orientating portion 64 for orientating the install position of the programmable control unit P. The push bar 12 passes through an opening 641 of the orientating portion 64 (as shown in FIG. 1), and the pushing portion 122 of the push bar 12 is protruded from the casing 6 through the opening 641. When the programmable control unit P is assembled with the bottom board B, the programmable control unit P and the bottom board B form an angle to allow the orientating portion 64 to abut against a corresponding board orientating portion BP of the bottom board B. In this case, the pushing portion is not pushed yet (as shown in FIGS. 3A and 4A). Then, the programmable control unit P rotates with the orientating portion 64 as an axis until that the outer surface 63 of the casing 6 contacts against the bottom board B, followed by assembling the connecting port 61 with the board connector BC. During the installation procedure, the pushing portion 122 is pressed by the board orientating portion BP while the casing 6 is rotated, so that the pushing portion 122 slides toward the direction D3 (as shown in FIGS. 3B and 4B). Consequently, the barrier 11 of the programmable control unit P moves to the second position to uncover the connecting port 61 for assembling the programmable control unit P with the bottom board B just before that the connecting port 61 contacts with the board connector BC.

In this embodiment, the orientating portion 64 of the casing 6 is a protruding portion, while the board orientating portion BP of the bottom board B is a concave portion. However, it is also possible that the orientating portion 64 is a concave portion while the board orientating portion BP is a corresponding protruding portion. In brief, the present invention does not limit the aspect and orientation method of the orientating portion 64 and the board orientating portion BP. In addition, the push bar 12 may be disposed passing through the orientating portion 64 or adjacent to the orientating portion 64. Of course, the push bar 12 may also be disposed at any end of the programmable control unit P which can contact the bottom board B at the beginning of the assembling, so that the push bar 12 can be pushed and moved during the installation.

In summary, the linkage device can use the push bar, which moves linearly, to drive the barrier to rotate, thereby changing the position of the barrier to open or close the connecting port of the casing. This configuration can move the barrier between the closing position (first position) and the opening position (second position) within a short distance of displacement. Accordingly, it is possible to prevent the connecting port from being contacted by undesired objects or to avoid the undesired installation. In addition, since the push bar is slightly protruded from the casing, the appearance of the casing is not interfered. This can keep the beautiful and original appearance of the casing, which may also decrease the cost. Moreover, the linkage device of the invention can be a detachable structure. In practice, the corners thereof have the round-corner design for facilitating the following assembling. Besides, the linkage device can be made of recyclable plastic materials.

The programmable control unit of the invention can be assembled with the bottom board through the linkage device as well as the above-mentioned operation of rotating the barrier. To assemble the programmable control unit with the bottom board, one end of the programmable control unit is positioned on the bottom board, and then rotated to allow the surface with the connecting port to abut against the bottom board. During the rotation of the programmable control unit, the linkage device is pushed from the closing position to the opening position. The programmable control unit with the linkage device can be easily and actually assembled and can avoid the undesired contact, which may affect the electrical properties. Accordingly, the invention can prevent the short circuit and damage of the programmable control unit during the assembling procedure, thereby increasing the reliability of the programmable control unit and decreasing the assembling cost for operators.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A linkage device cooperating with a casing, which has a connecting port, comprising:
    a barrier pivotly disposed on the casing and positioned at a first position or a second position with respect to the connecting port of the casing, wherein when the barrier is at the first position, the barrier covers at least a part of the connecting port; otherwise, when the barrier is at the second position, the barrier does not cover the connecting port; and
    a push bar slidingly disposed on the casing and abutting against the barrier;
    wherein, when the push bar pushes the barrier, the barrier rotates from the first position to the second position,
    wherein the barrier comprises a first connecting portion, the push bar comprises a second connecting portion, and the second connecting portion of the push bar abuts against the first connecting portion of the barrier,
    wherein one of the first connecting portion and the second connecting portion is a long-shaped through hole or a long-shaped concave portion, the other one thereof is a protruding portion, and when the push bar is pushed, the protruding portion moves from one end of the long-shaped through hole or the long-shaped concave portion to the other end thereof, thereby rotating the barrier from the first position to the second position.

2. The linkage device of claim 1, wherein the casing comprises a recess, and the linkage device is disposed in the recess.

3. The linkage device of claim 2, wherein the recess comprises at least one fixing portion for fixing the linkage device.

4. The linkage device of claim 2, wherein when the barrier is disposed in the second position, the barrier is received in the recess.

5. The linkage device of claim 1, wherein the barrier is thick enough to protrude from the casing.

6. The linkage device of claim 1, further comprising:
    an elastic element connected between the casing and the push bar, wherein when the push bar is pushed, the push bar presses against the elastic element.

* * * * *